US008085042B2

(12) United States Patent
Graessner et al.

(10) Patent No.: US 8,085,042 B2
(45) Date of Patent: Dec. 27, 2011

(54) METHOD AND DEVICE FOR AUTOMATIC DETERMINATION OF SLICE POSITIONS IN AN MR EXAMINATION

(75) Inventors: Joachim Graessner, Boenningstedt (DE); Bianca Samsula, Syke (DE)

(73) Assignee: Siemens Aktiengesellschaft, Munich (DE)

( * ) Notice: Subject to any disclaimer, the term of this patent is extended or adjusted under 35 U.S.C. 154(b) by 392 days.

(21) Appl. No.: 12/328,885

(22) Filed: Dec. 5, 2008

(65) Prior Publication Data
US 2009/0146659 A1   Jun. 11, 2009

(30) Foreign Application Priority Data
Dec. 6, 2007   (DE) .......................... 10 2007 058 682

(51) Int. Cl.
G01V 3/00   (2006.01)
(52) U.S. Cl. ......... 324/307; 324/309; 324/318; 324/306
(58) Field of Classification Search .......... 324/300–322; 382/128–131; 600/407–435
See application file for complete search history.

(56) References Cited

U.S. PATENT DOCUMENTS

| | | | | |
|---|---|---|---|---|
| 4,694,254 A * | 9/1987 | Vatis et al. | .................... | 324/309 |
| 4,961,425 A * | 10/1990 | Kennedy et al. | .............. | 600/425 |
| 5,185,809 A * | 2/1993 | Kennedy et al. | .............. | 600/425 |
| 6,249,594 B1 * | 6/2001 | Hibbard | ......................... | 382/128 |
| 6,597,935 B2 * | 7/2003 | Prince et al. | .................... | 600/410 |
| 7,348,774 B2 * | 3/2008 | Biglieri et al. | ................. | 324/307 |
| 7,399,220 B2 * | 7/2008 | Kriesel et al. | .................. | 452/157 |
| 7,545,979 B2 * | 6/2009 | Fidrich et al. | .................. | 382/173 |
| 7,668,349 B2 * | 2/2010 | Fradkin et al. | ................. | 382/120 |
| 7,714,576 B2 * | 5/2010 | Van Den Brink et al. | ..... | 324/318 |
| 2001/0031037 A1 * | 10/2001 | Prince et al. | .................... | 378/137 |
| 2003/0144589 A1 | 7/2003 | Roell | .............................. | 600/410 |
| 2005/0267352 A1 * | 12/2005 | Biglieri et al. | ................. | 600/410 |
| 2006/0228009 A1 * | 10/2006 | Fidrich et al. | .................. | 382/128 |
| 2006/0241379 A1 | 10/2006 | Greiser et al. | ................. | 600/410 |
| 2007/0055138 A1 * | 3/2007 | Edelman | ......................... | 600/411 |
| 2007/0191703 A1 | 8/2007 | Graf | ................................ | 600/410 |
| 2008/0205721 A1 * | 8/2008 | Udupa et al. | .................... | 382/128 |
| 2008/0303519 A1 * | 12/2008 | Van Den Brink et al. | ..... | 324/307 |
| 2009/0146659 A1 * | 6/2009 | Graessner et al. | ............. | 324/309 |
| 2010/0052680 A1 * | 3/2010 | Wohlfarth | ........................ | 324/309 |
| 2010/0237863 A1 * | 9/2010 | Stemmer | .......................... | 324/309 |
| 2010/0312094 A1 * | 12/2010 | Guttman et al. | .............. | 600/411 |
| 2010/0331664 A1 * | 12/2010 | Graessner | ....................... | 600/410 |

* cited by examiner

Primary Examiner — Melissa Koval
Assistant Examiner — Tiffany Fetzner
(74) Attorney, Agent, or Firm — Schiff Hardin LLP

(57) ABSTRACT

Two method and device embodiments allow automatic determination of slice positions in an MR examination in an MR system. In the first embodiment, a volume to be measured by the MR examination is predetermined. The MR examination is subsequently planned in that at least one of the parameters slice direction, slice interval, slice thickness, number of slices for the MR examination is adapted such that an extent in the slice direction of the MR examination essentially corresponds to the predetermined volume. In the second embodiment, at least one volume segment is predetermined. Multiple slices for the MR examination are subsequently determined such that each volume segment is contained in at least one of the slices.

17 Claims, 3 Drawing Sheets

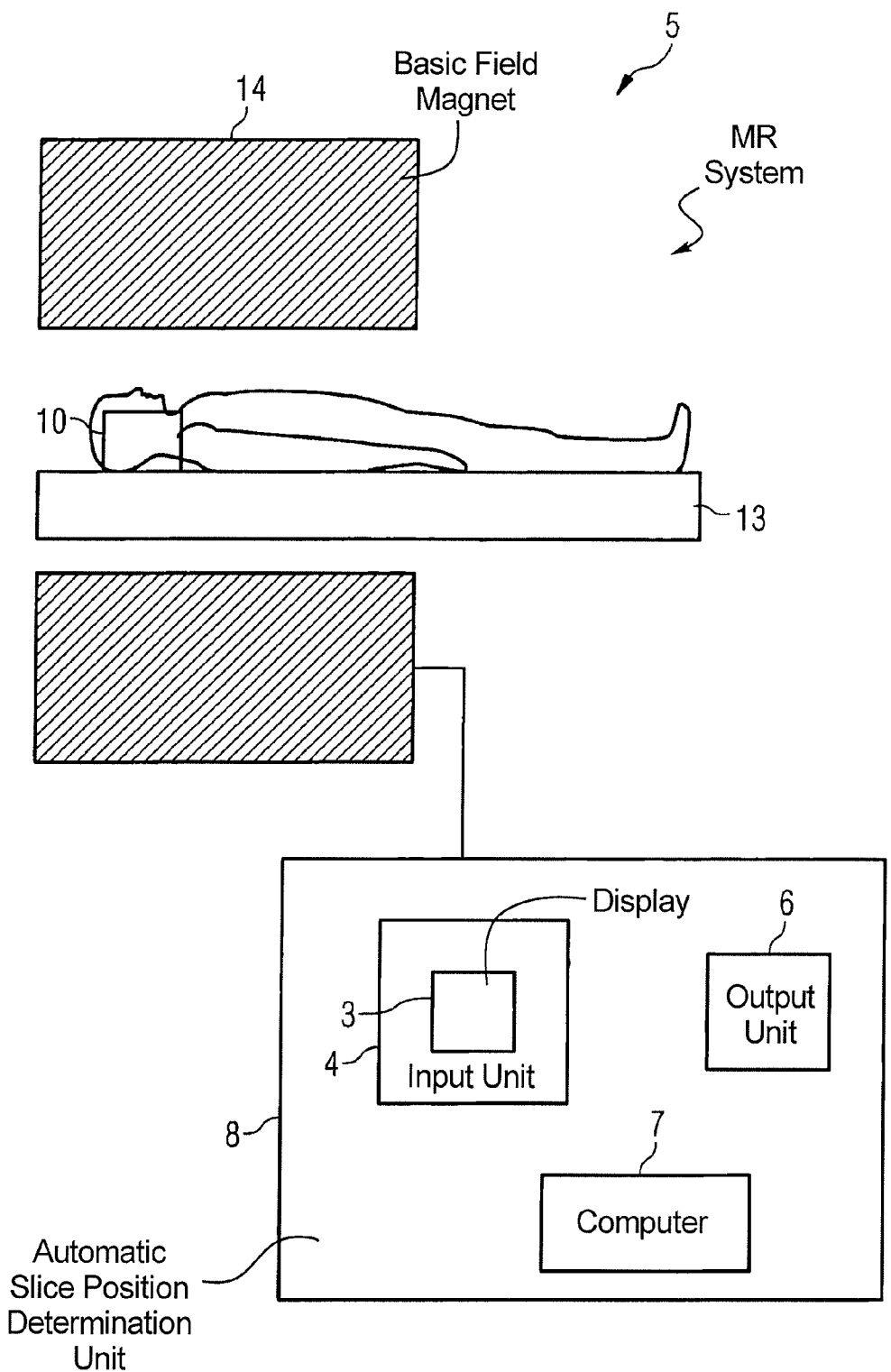

METHOD AND DEVICE FOR AUTOMATIC DETERMINATION OF SLICE POSITIONS IN AN MR EXAMINATION

BACKGROUND OF THE INVENTION

1. Field of the Invention

The present invention concerns a method and a device to automatically determine slice positions for a magnetic resonance (MR) examination.

2. Description of the Prior Art

Slice positions in an MR examination are determined such that a volume that corresponds to a predetermined volume (for example a volume that likewise was measured by a previously conducted MR examination) is measured in a current MR examination. It is also possible to determine the slice positions such that predetermined volume segments (for example lesions detected in a preceding MR examination) are contained as optimally as possible in the determined slices.

In order to be able to generate optimally precise diagnoses based on MR images that are generated by a magnetic resonance system (MR system), it is frequently necessary to conduct multiple MR examinations or MR measurements of the same volume (for example the abdomen of a patient). These MR examinations can be differentiated with regard to their contrast (for example T1, T2, T2*) and/or with regard to their settings as to slice thickness, slice interval, number of slices, and slice direction.

In order to be able to provide an optimally precise diagnosis with multiple MR examinations wherein, for example, a specific volume region (for example a specific organ) in a human body is analyzed, it is necessary for this specific volume region to be contained in the respective volume that is measured by the respective MR examination. According to the prior art it is only possible to manually predetermine specific parameters for an MR examination—for example the slice thickness, the slice interval and the number of the slices—such that the volume region lies within a volume that is then measured by the manually set MR examination.

Moreover, it frequently is the case that one or more specific volume segments (for example one or more lesions) which were found in an MR examination should be analyzed further with an additional MR examination. According to the prior art, it is likewise possible only to set the corresponding parameters for the additional MR examination manually, such that this/these volume segment(s) lie(s) as well as possible within the volume which is then measured by the additional MR examination.

How well the predetermined volume range or the at least one predetermined volume segment is then covered by the additional MR examination depends significantly on the capabilities of the operator operating the corresponding MR system.

SUMMARY OF THE INVENTION

An object of the present invention is to overcome the problems outlined above such that a coverage of the predetermined volume segment, or of at least one predetermined volume segment, no longer depends so significantly on the capabilities of the operator operating the MR system, as according to the prior art.

A method for automatic determination of slice positions given an MR examination in an MR system is provided by the present invention. A volume to be measured by the MR examination is thereby predetermined. The MR examination is subsequently automatically planned such that at least one of the following parameters a slice direction
A direction in which the slices of the MR examination are measured; the slice direction is perpendicular to the respective measured slice.
a slice interval
An interval between two adjacent slices.
a slice thickness
A thickness of the respective slice in the slice direction.
a number of slices
A number of the slices measured for the respective MR examination.

is adapted such that a volume or, respectively, an extent in the slice direction of the MR examination that is measured by the planned MR examination corresponds to the predetermined volume.

According to the invention, at least one of the aforementioned parameters is adapted such that the planned MR examination measures a volume which corresponds to the predetermined volume. In other words, it is possible that all but one parameter are predetermined, and then the remaining parameter (for example the slice interval or the number of slices) is automatically adapted such that the extent in the slice direction of the planned MR examination is (essentially) equal to the predetermined volume. Naturally, according to the invention it is also possible that all parameters are automatically adapted or, respectively, determined so that the planned MR examination measures the predetermined volume.

Since the volume to be measured by the MR examination can be predetermined, this volume can now be determined such that a volume region of interest (for example a specific organ) lies within this volume, or such that the predetermined volume corresponds to the volume region. In that the predetermined volume is selected such that specific volume segments which were acquired in a previous MR examination are contained in this predetermined volume, it is advantageously ensured that these volume segments also lie in the volume measured by the planned MR examination.

Therefore, the method according to the invention solves both problems described above that exist in the prior art.

A slice table with regard to the planned MR examination can advantageously be output. This slice table contains a position and an alignment for every slice of the planned MR examination. In the event that the alignment or slice direction for all slices is the same, the slice table can naturally also globally contain this slice direction just once and then specify only the respective position for each slice of the planned MR examination.

An operator of the associated MR system receives information about the planned MR examination by means of the slice table, depending on this information, can make changes as necessary to the planned MR examination or, respectively, to a protocol for the planned MR examination.

At least one of the following parameters can be adopted from a previously conducted MR examination:
the slice direction,
the slice interval,
the slice thickness,
the number of slices, and
the predetermined volume.

For example, if the predetermined volume is adopted from a previously conducted MR examination, according to the invention it is ensured that an MR examination following this already-conducted MR examination also measures the same volume. In this case, the predetermined volume is calculated dependent on the slice interval, the slice thickness and the number of slices of the previously conducted MR examination. The extent of the predetermined volume in the slice direction is thereby calculated via the following Equation (1).

$$\text{Extent in the slice direction} = \text{Number of slices} * \text{Slice thickness} + \text{Slice interval} * (\text{Number of slices} - 1) \quad (1)$$

For example, an extent in the slice direction (known from a previously conducted MR examination) can thereby be transferred as a normalizing variable to a measurement protocol of the further MR examination to be planned. For example, in this further MR exam the slice interval can then be varied, wherein the slice thickness and the slice direction are adopted from the previously conducted MR examination and the number of slices is correspondingly adapted. Naturally, it is also conceivable that the slice thickness is also changed. In spite of this, it is ensured that a coverage or, respectively, a volume measured by the further MR examination is essentially equal to the coverage of the previously conducted MR examination (thus equal to the volume measured by the previously conducted MR examination).

In a generation of a protocol for the planned additional MR examination, the desired coverage range in the slice direction can accordingly be defined or, respectively, predetermined as fixed, such that—in spite of a change of number of slices, slice interval and slice thickness—this coverage region is covered or measured by the planned MR examination.

Naturally, it is also possible for all parameters specified above to be adopted from the planned MR examination, since in this case the volume measured by the previously implemented MR examination inevitably corresponds to the volume measured by the planned MR examination.

Often, for the planned MR examination the predetermined volume from the previously conducted MR examination is calculated and the slice direction is adopted from the previously conducted MR examination. The parameters slice thickness, slice interval and number of slices are then correspondingly adapted or, respectively, determined so that the volume to be measured by the planned MR examination corresponds to the predetermined volume derived from the previously implemented MR examination.

In an embodiment according to the invention, at least one volume segment can be predetermined for the planned MR examination. The parameters slice direction, slice interval, slice thickness and number of slices are then determined for the planned MR examination such that each of the at least one volume segments lies in at least one slice of the planned MR examination.

The phase "that each of the at least one volume segments lies in at least one slice of the planned MR examination" as used herein means "that, if the at least one volume segment is one volume segments, this volume segment lies in at least one slice of the planned MR examination, and if the at least one volume segment consists of multiple volume segments, each of these volume segments lies in at least one slice of the planned MR examination."

Other formulations which contain the term "the at least one volume segment" (for example "many of the at least one volume segments") are to be correspondingly interpreted.

In this embodiment, it is thus ensured that the planned MR examination measures the predetermined volume, and it is ensured that specific volume segments which have stood out in a previously conducted MR examination are contained in the slices of the planned MR examination.

The at least one volume segment can be determined by an operator of the MR system in MR images which were generated by a previously conducted MR examination.

It is therefore advantageously possible to examine specific volume segments of interest (for example lesions which stood out in MR images from a previously conducted MR examination and therefore have been marked) again in MR images of the planned MR examination since, according to the invention, it is ensured that these volume segments are also contained in the slices of the planned MR examination by means of which the MR images of the planned MR examination are generated.

With regard to the slice direction of the planned MR examination, the following variants are possible according to the invention:
1. The slice direction of the planned MR examination significantly corresponds to a predetermined slice direction.
2. The slice direction of the planned MR examination lies essentially perpendicular to a predetermined slice direction.
3. The slice direction of the planned MR examination forms an arbitrary angle relative to a predetermined slice direction.

In all three aforementioned variants, the slices of the planned MR examination are automatically determined such that each of the at least one volume segments lies in at least one of the slices of the planned MR examination. However, in particular in Variant 3 it is also possible to select the slice direction such that as many volume segments as possible are contained in the single slice. For example, if four lesions should be contained as predetermined lesions in the slices of the planned MR examination, and if it is possible that two of these lesions are respectively contained in the same slice in a predetermined slice direction, in an embodiment of Variant 3 according to the invention the slice direction would be selected this way.

If the slice direction respectively predetermined for the three variants is the slice direction of a previously conducted MR examination, the slice direction of the planned MR examination in Variant 1 significantly corresponds to the slice direction of the previously conducted MR examination. In Variant 2, the slice direction of the planned MR examination then lies essentially perpendicular to the slice direction of the previously implemented MR examination, and in Variant 3 the slice direction of the planned MR examination is essentially independent of the slice direction of the previously conducted MR examination.

There are the three following, important possibilities so that the planned MR examination measures the predetermined volume:
1. The slice interval between two slices is automatically adapted.
2. The number of slices is automatically adapted.
3. The slice thickness is automatically adapted.

In Possibility 1 described above, in particular the slice thickness and the number of slices is predetermined, while in Possibility 2 in particular the slice interval and the slice thickness are predetermined, and in Possibility 3 in particular the slice interval and the number of slices are predetermined. In all three possibilities listed above, two parameters (from slice interval, slice thickness and number of slices) are thus known in addition to the predetermined volume, and the respective missing parameter is determined such that the volume measured by the planned MR examination corresponds to the predetermined volume.

In a further embodiment, the slices of the planned MR examination are determined such that multiple concrete slice groups or, respectively, slice groups separate from one another are generated. Each of these slice groups thereby consists of at least one slice planned for the MR examination. In the implementation of the MR examination, the slice or the slices of each discrete slice group is measured as a block or as a conjunction [combination; correlation]. In other words, the slices of the planned MR examination are divided into multiple slice groups according to specific criteria such that a slice is located in only one slice group.

For example, it is possible for the same slice direction and the same slice interval to apply for the slice or the slices of the respective slice group. (The slice interval naturally only makes sense when the corresponding group is composed of multiple slices.) In other words, the slices of the same slice group are characterized in that these slices exhibit the same slice interval and the same slice direction. The slice interval and the slice direction which apply for the one slice group thereby normally differ from the slice interval and the slice direction of another slice group of the MR examination, which is why it is also advantageous that the slices of one group are measured as a block or as a conjunction, since the settings at the MR system must normally be changed less between two slices of the same group than between two slices of different groups.

The groups of an MR examination can also be distributed such that their distribution corresponds to the distribution of the predetermined volume segments, i.e. for example the distribution of the previously found lesions. For example, if lesions were found in multiple regions, a group can then be associated with each lesion, wherein the slices of the respective group are then determined such that each lesion is contained in one slice in the corresponding region. No groups and thus no slices are then advantageously associated with regions in which no lesions were detected, so the time to implement the planned MR examination can be decreased.

According to the invention it is thus possible for the planned MR examination to determine multiple slice groups, wherein the slice interval and the slice tilt or the slice direction is/are adapted for each slice group such that lesions in a region associated with the slice group are covered as optimally as possible by the slices of this slice group. A slice direction of a first group which follows a second group (in terms of measurement) thereby normally deviates only slightly (less than 10°) from a slice direction of the second group.

In accordance with the present invention, a further method embodiment for automatic determination of slice positions is also provided in an MR examination in an MR system. At least one volume segment is predetermined in this method embodiment. Multiple slices for the MR examination are automatically determined depending on this at least one volume segment, such that each of the at least one volume segment is contained in at least one of these slices of the planned MR examination.

This method embodiment according to the invention also solves the two problems that exist in advance from the prior art. If a volume region of interest (for example an organ) is set equal to the at least one predetermined volume segment, it is ensured that this volume region is measured by the planned MR examination. Since the method according to the invention ensures that each predetermined volume segment image storage system contained in at least one slice of the planned MR examination, the second problem listed above according to the prior art is solved [sic] that, for example, volume segments (for example lesions) that stood out before during a previously conducted MR examination are contained in the slices of the planned MR examination.

The slices of the planned MR examination can also be determined such that a slice quantity between the at least one volume segment and the slices is as large as possible or, respectively, is (essentially) maximal. In other words, the slices of the planned MR examination are determined such that the predetermined volume segment or segments optimally is/are entirely within the slices. If a predetermined volume segment would thus be fitted (in terms of its dimensions) into a slice of the planned MR examination, one of the slices of the planned MR examination is also determined such that the predetermined volume segment lies entirely in this slice. In contrast to this, if a predetermined volume segment exhibits such dimensions that it cannot be contained in only one of the slices of the planned MR examination (for example since its dimensions in the slice direction are provided such that they are greater than a maximum slice thickness), the slice interval between slices which exhibit a slice quantity with this predetermined volume segment is set to a minimum possible value.

The phrase "that the slice quantity is essentially maximal" as used herein means that the maximum is aimed for, but that the method according to the invention is also content with a result which is below a maximum conceivable solution by a predetermined percentile (for example 10%).

In the following, differences are described between the first method according to the invention that was described first and the second method according to the invention that was subsequently described.

In the first method embodiment, a volume is predetermined and the slices of the planned MR examination are determined such that it is ensured that the slices measure the predetermined volume. By contrast, in the second method embodiment one or more volume segments are predetermined, and the slices of the planned MR examination are determined such that it is ensured that each of the volume segments lies in at least one of the slices.

The MR examination can be conducted via 2D measurements or via 3D measurements both in the first method according to the invention and in the second method according to the invention. In this regard it is to be noted that, in 3D measurements, one normally doesn't speak of slices but rather of blocks, such that given a 3D measurement the slice thickness corresponds to a block thickness, the slice interval corresponds to a block interval between two adjacent blocks and the number of slices corresponds to a number of blocks. In a 3D measurement, the slice direction corresponds to a direction in which the blocks are measured so that this direction is perpendicular to the respective measured block and points in the direction of the next block to be measured.

The statements or discussions of embodiments of the first method according to the invention naturally correspondingly apply for the second method. This in particular applies for embodiments in which predetermined volume segments also play a role, independent of a predetermined volume. These embodiments should then be read without predetermined volume, corresponding to the second method embodiment according to the invention.

In accordance with the present invention, a device for an MR system is also provided for automatic determination of slice positions in an MR examination. The device includes an input unit and a computer. The device is designed such that the device a volume which is to be measured by the MR examination can be predetermined via the input unit. With the aid of the computer, the device adapts at least one parameter (from slice direction, slice interval, slice thickness and number of slices) with regard to the planned MR examination such that the MR examination measures the predetermined volume or an extent of in the slice direction corresponds to the predetermined volume.

In accordance with the present invention, an additional device for an MR system is provided for automatic determination of slice positions in an MR examination. This device also comprises an input unit and a computer. One or more volume segments can be predetermined by the device via the input unit. With the aid of the computer, the device determines subsequent slice positions of multiple slices for the planned MR examination such that the one volume segment or each of the multiple volume segments is contained in at least one of the slices for the planned MR examination.

The advantages of the two devices according to the invention that are realized in the preceding significantly correspond to the advantages which have previously been described in the discussion of the two methods according to the invention, which is why a repetition is omitted here.

In accordance with the present invention, a magnetic resonance system is also provided that embodies at least one of the devices described above.

Moreover, the present invention encompasses a computer-readable medium can be loaded into a memory of a programmable controller of a magnetic resonance system, that is encoded with programming instructions to implement any and all embodiments of the method described above.

The present invention can at least simplifies the problem of the nearly exactly equal volume coverage in multiple MR examinations with different slice and slice interval settings with complementary contrasts (for example T1, T2, T2*). Moreover, the problem of the slice-exact encompassing of multiple lesions is solved by the present invention. Even given orthogonal slice directions (i.e. the slice directions of a previous MR examination and a following MR examination based on the results of the previous MR examination are perpendicular to one another), multiple lesions are fitted into respective slices of the following MR examination, such that no danger exists that a finding (for example a lesion) will be overlooked in measurements with a slice gap, whereby the error rate is lowered.

A more precise assessment by an assessor is possible due to the nearly exactly identical coverage. In that the slices of an MR examination to be planned are determined such that lesions are respectively contained in at least one of these slices, the partial volume effect (in a volume element, for example, multiple tissue types are shown due too-low resolution) is reduced even given orthogonal slice direction and given manually selected target lesions.

The present invention is advantageously suited for a use in magnetic resonance systems in order to traverse [durchmessen: measure through?] a volume traversed by a previously conducted MR examination again with an additional MR examination, or in order to ensure that specific volume segments which were covered in MR images of a previously conducted MR examination are also contained in MR images or slices of an additional MR examination. Naturally, the present invention is not limited to this preferred application scope; rather, it can also be used when a volume predetermined by an arbitrary point should be measured by an MR examination, or when slices of a planned MR examination should be determined such that specific predetermined volume segments are contained in these slices.

BRIEF DESCRIPTION OF THE DRAWINGS

FIG. 3 schematically illustrate, a magnetic resonance system according to the invention.

DESCRIPTION OF THE PREFERRED EMBODIMENTS

An MR system 5 is schematically presented in FIG. 3. This MR system has a basic field magnet 14 to generate a polarization field B0, wherein an examination person is arranged on a bed 13. The magnetization generated in a volume 10 of the examination person can be excited with a radio-frequency pulse via an RF arrangement (not shown). How an MR image is generated in a magnetic resonance system via radiation of a sequence of RF pulses and gradients is known in general to those skilled in the art, so that a detailed explanation of this is not necessary herein.

Figure 1A:
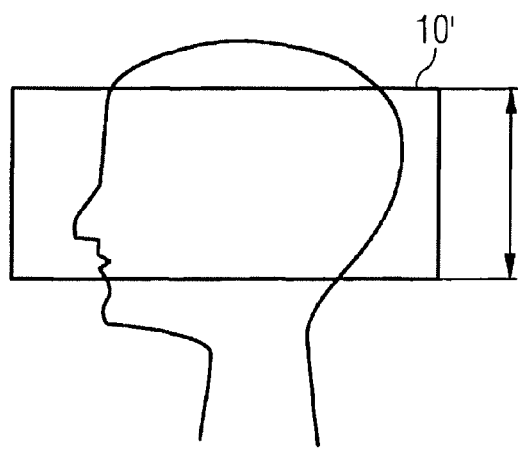
FIGS. 1a and 1b respectively illustrate two MR examinations of the same volume.
Figure 1B:
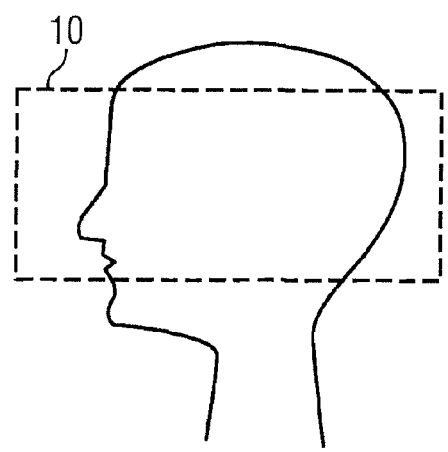

A volume 10' which was measured with 20 slices by a first MR examination is shown in FIG. 1a, wherein each slice exhibits a slice thickness of 3 mm, and a slice interval or a slice gap between two adjacent slices is respectively 0.3 mm. Starting from this volume 10' measured by the first MR examination, the parameters number of slices, slice thickness and slice interval are now determined by a second MR examination such that, given the same slice direction, the second MR examination measures the volume 10 which corresponds to the volume 10' (FIG. 1b). For example, for the second MR examination it would be possible that the slice thickness is determined with 2 mm, the slice interval with 0.2 mm and the number of slices with 30.

From the aforementioned example it can be recognized that the extent in the slice direction does not need to exactly coincide with the predetermined volume. It is sufficient when, given a constant slice thickness and a constant slice interval, the coverage of the slices in the slice direction is greater than or equal to a difference from a corresponding length of the predetermined volume in the slice direction and the constant slice interval.

Figure 2A:
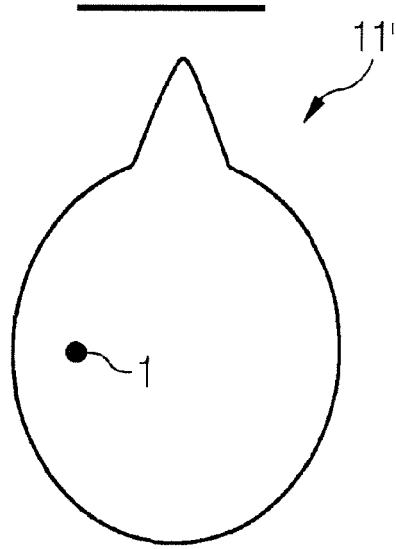
FIGS. 2a, 2b, 2c, and 2d respectively illustrate two slices of each of two MR examinations.
Figure 2B:
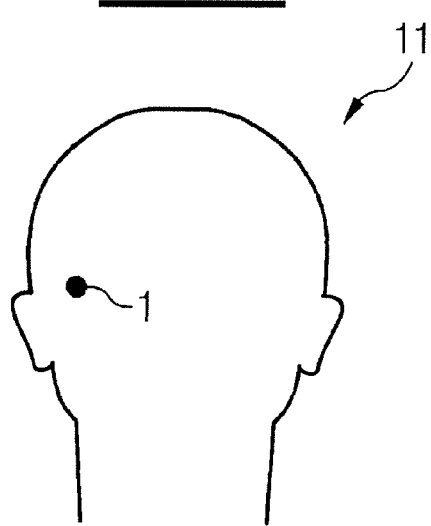
Figure 2C:
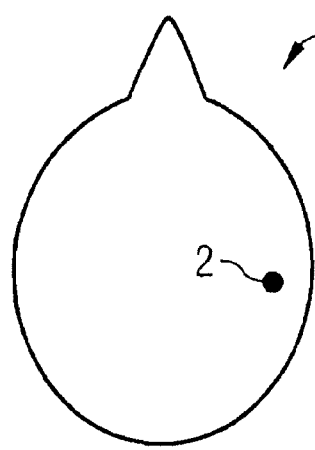
Figure 2D:
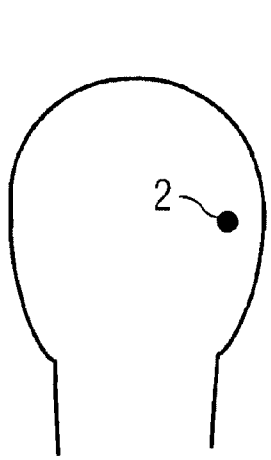

A first slice 11' of a first MR examination is shown in FIG. 2a and a second slice 12' of this first MR examination is shown in FIG. 2c. In the first MR examination, the slice direction is thereby transverse, i.e. the two shown slices 11', 12' are parallel to the floor. It is recognized that a first lesion 1 is imaged in the first slice 11' and a second lesion 2 is imaged in the second slice 12'.

For example, these two lesions 1, 2 are now marked by a physician who analyzes the MR images generated image acquisition the first MR examination. A second MR examination with a coronary slice direction should now be planned starting from these two lesions 1, 2 or these two volume segments 1, 2, such that it is ensured that both the first lesion 1 and the second lesion 2 are respectively contained in a slice 11, 12 of the second MR examination.

Starting from the two volume segments 1, 2, the parameters slice interval, slice thickness and number of slices for the second MR examination are now determined such that both the first lesion 1 and the second lesion 2 lie at least in one slice 11, 12 of the second MR examination.

It should be noted that it is nearly impossible to manually determine the parameters slice interval, slice thickness and number of slices for the second MR examination such that either the first lesion 1 or the second lesion 2 or even both does not fall into a slice gap in the second MR examination since the transverse slice direction of the first MR examination is perpendicular to the coronal slice direction of the second MR examination, such that a simple adoption of the corresponding parameters slice interval, slice thickness and number of slices from the first MR examination for the second MR examination at most also coincidentally produces the desired result, namely that both lesions 1, 2 are situated in at least one slice of the second MR examination.

The magnetic resonance system 5 according to the invention that is schematically presented in FIG. 3 has a device 8 according to the invention for automatic determination of slice positions in an MR examination. The device 8 according to the invention for its part comprises an input unit 4 with a display unit 3, an output unit 6 and a computer 7. A volume 10' from which data are to be acquired in an MR examination to be planned by means of the device 8 can be predetermined via the input unit 4 of the device 8. Moreover, the device 8 can be used to predetermine specific volume segments 1, 2 via the input unit 4, which volume segments 1, 2 must be respectively contained in at least one slice 11, 12 of the MR examination to be planned by means of the processor 8. The specification of these volume segments 1, 2 can ensue such that MR images of a previously conducted MR examination are displayed on the display unit 3, and the volume segments 1, 2 (which can correspond to lesions) are marked in these MR images, for example with a computer mouse.

There are now the following three basic alternatives in the input to be made by means of the input unit 4:
1. specification of a volume 10'
2. specification of volume segments 1, 2
3. specification both of a volume 10' and of volume segments 1, 2

Depending on this specification, the slice positions of the slices of the MR examination to be planned are then determined in the computer 7. Additional specific parameters such as slice thickness, slice interval and number of slices can thereby be predetermined via the input unit 4 for the MR examination to be planned, wherein it must naturally be taken into account that the method according to the invention is more limited the more parameters that are predetermined.

Starting from the corresponding specification, the computer 7 then calculates the slice positions of the slices 11, 12 of the MR examination to be planned as follows for the three alternatives indicated above:
1. The slices of the planned MR examination cover the predetermined volume.
2. Each of the volume segments 1, 2 is contained in at least one slice 11, 12 of the planned MR examination.
3. The slices of the planned MR examination cover the predetermined volume 10', and each of the volume segments 1, 2 is contained in at least one of these slices 11, 12.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for automatically determining slice positions in a magnetic resonance (MR) examination in an MR system, comprising the steps of:

entering predetermined volume data as an input into a processor representing a predetermined volume from which MR data are to be acquired in an MR examination of a subject;

also entering volume segment data as another input into said processor that represent at least one predetermined volume segment, without designation of a slice, of said predetermined volume for said MR examination;

in said processor, planning said MR examination of said subject to automatically determine, from only the inputs of said volume data and said volume segment data, respective slice positions of slices in the subject from which said MR data are to be acquired, that cause said at least one volume segment to be completely contained in at least one of said slices; and making a specification of said automatically determined slice positions available as an output from said processor in a form allowing operation of said MR system to acquire said MR data from at least one slice respectively at, at least one of said automatically determined slice positions.

2. A method as claimed in claim 1 comprising, in said processor, automatically generating a slice table for said MR examination that indicates a position and an alignment for each slice of said MR examination, and emitting said slice table as said output from said processor.

3. A method as claimed in claim 1 comprising, in said planning of said MR examination by operation of said processor, automatically selecting, in said processor, at least one parameter selected from the group consisting of slice direction, slice interval, slice thickness, and number of slices by adapting said at least one parameter in said processor to cause an extent of said acquisition of MR data in a slice direction in said MR examination to substantially correspond to said predetermined volume.

4. A method as claimed in claim 3 comprising adapting said at least one parameter for planning said MR examination from a corresponding parameter used in a previous MR examination implemented prior to said MR examination.

5. A method as claimed in claim 1 comprising using, as said data representing said at least one volume segment, data representing a volume segment for which magnetic resonance images were generated in a previous MR examination conducted prior to said MR examination.

6. A method as claimed in claim 1 comprising:
entering slice direction data into said processor that represents a predetermined slice direction; and
in said processor, adapting a slice direction of at least one of said slices to cause the slice direction in said MR examination to substantially coincide with said predetermined slice direction.

7. A method as claimed in claim 1 comprising:
entering slice direction data into said processor that represents a predetermined slice direction; and
in said processor, adapting a slice direction of at least one of said slices to cause the slice direction in said MR examination to be substantially perpendicular to said predetermined slice direction.

8. A method as claimed in claim 1 comprising entering volume segment data into said processor that represents at least one predetermined volume segment for said MR examination;
entering slice selection data into said processor representing a predetermined slice direction; and
in said processor, adapting a slice direction of at least one of said slices to cause respective slices in said MR examination to contain as much of said at least one volume segment as possible.

9. A method as claimed in claim 3 comprising adapting a slice interval between two slices, as said at least one parameter, for said MR examination to cause a volume of the subject from which magnetic resonance data are acquired to substantially correspond to said predetermined volume.

10. A method as claimed in claim 3 comprising adapting a number of slices, as said at least one parameter, for said MR examination to cause a volume of the subject from which magnetic resonance data are acquired to substantially correspond to said predetermined volume.

11. A method as claimed in claim 3 comprising adapting a slice thickness, as said at least one parameter, for said MR examination to cause a volume of the subject from which magnetic resonance data are acquired to substantially correspond to said predetermined volume.

12. A method as claimed in claim 3 comprising, in said processor, identifying, from said at least one parameter, a plurality of discrete slice groups that each contain at least one slice, and acquiring magnetic resonance data in said magnetic resonance examination from at least one slice of each slice group as a block or conjunction.

13. A method as claimed in claim 12 comprising resonating said at least one slice for each of said plurality of slice groups as having a same slice interval and same slice direction.

14. A method as claimed in claim 12 comprising:
in said processor, automatically determining said plurality of slice groups to cause magnetic resonance data acquisition from said at least one volume segment to be distributed among said plurality of slice groups.

15. A controller for automatic determination of slice positions in a magnetic resonance (MR) examination in an MR system, comprising:
a processor;
an input unit allowing input of predetermined volume data into said processor representing a predetermined volume from which MR data are to be acquired in an MR examination of a subject;
said input unit also allowing another input of volume segment data into said processor, without designation of a slice, representing at least one predetermined volume segment of said predetermined volume for said MR examination;
said processor being configured to plan said MR examination of said subject to automatically determine, from only the inputs of said volume data and said volume segment data, respective slices of the subject from which said MR data will be acquired, to cause said acquisition of MR data from said multiple slices in said MR examination to completely encompass each of said at least one volume segment, and to make a specification of said automatically determined slice positions available as an output in a form allowing operation of said MR system to acquire said MR data from at least one slice respectively at, at least one of said automatically determined slice positions.

16. A controller as claimed in claim 15 wherein said processor is configured to, in said planning of said MR examination, automatically select at least one parameter selected from the group consisting of slice direction, slice interval, slice thickness, and number of slices, by adapting said at least one parameter to cause an extent of said acquisition of MR data in a slice direction in said MR examination to substantially correspond to said predetermined volume.

17. A computer-readable medium encoded with programming instructions for automatically determining slice positions in a magnetic resonance (MR) examination in an MR system, said medium being loadable into a processor and said programming instructions causing said processor to:
allow entry of predetermined volume data as an input into the processor representing a predetermined volume from which MR data are to be acquired in an MR examination of a subject;
plan said MR examination of said subject to automatically determine, from only the inputs of said volume data and said volume segment data, respective slice positions of slices of the subject from which said MR data will be acquired, to cause said acquisition of MR data from said multiple slices in said MR examination to completely encompass each of said at least one volume segment; and
make a specification of the automatically determined slice positions available as an output from said processor in a form allowing operation of said MR system to acquire said MR data from at least one slice respectively at, at least one of said automatically determined slice positions.

* * * * *